(12) United States Patent
Smirnov et al.

(10) Patent No.: US 8,116,469 B2
(45) Date of Patent: Feb. 14, 2012

(54) HEADPHONE SURROUND USING ARTIFICIAL REVERBERATION

(75) Inventors: Serge Smirnov, Redmond, WA (US); Chris Messer, Sammamish, WA (US); Wei-Ge Chen, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 1264 days.

(21) Appl. No.: 11/771,886

(22) Filed: Jun. 29, 2007

(65) Prior Publication Data

US 2008/0212809 A1    Sep. 4, 2008

Related U.S. Application Data

(60) Provisional application No. 60/904,753, filed on Mar. 1, 2007.

(51) Int. Cl.
*H03G 3/00* (2006.01)
(52) U.S. Cl. ............... 381/63; 381/61; 381/62; 381/74; 381/99; 381/119; 381/309; 84/630; 84/707
(58) Field of Classification Search ............. 381/61–63, 381/309, 74, 99, 119; 84/630, 707
See application file for complete search history.

(56) References Cited

U.S. PATENT DOCUMENTS

| | | | |
|---|---|---|---|
| 4,748,669 A | 5/1988 | Klayman | |
| 5,371,799 A | 12/1994 | Lowe et al. | |
| 5,742,689 A | 4/1998 | Tucker et al. | |
| 5,751,817 A | 5/1998 | Brungart | |
| 6,421,446 B1 * | 7/2002 | Cashion et al. | 381/17 |
| 2003/0007648 A1 | 1/2003 | Currell | |
| 2004/0125967 A1 | 7/2004 | Eid et al. | |
| 2005/0117762 A1 | 6/2005 | Sakurai et al. | |
| 2005/0276430 A1 | 12/2005 | He et al. | |
| 2006/0029231 A1 | 2/2006 | Henn et al. | |

FOREIGN PATENT DOCUMENTS

WO    WO2007035055    3/2007

OTHER PUBLICATIONS

HeadWize, "Technologies for Presentation of Surround-Sound in Headphones," Technical Papers Library, <http://www.headwize.com/tech/sshd_tech.htm>, 21 pages, accessed Jun. 12, 2007.
HTPC Forums, "VideoReDo MPEG-2 Editor," <http://www.htpcforums.com/index.php?showtopic=566>, 2 pages, accessed Jun. 12, 2007.
Wave Arts, Inc., "Wave Arts Power Suite," <http://www.wavearts.com/pdfs/WaveArtsManual-v4.pdf>, 68 pages, 2005.

\* cited by examiner

*Primary Examiner* — Vivian Chin
*Assistant Examiner* — Paul Kim
(74) *Attorney, Agent, or Firm* — Klarquist Sparkman, LLP

(57) ABSTRACT

A surround experience for headphones can be created using various techniques and tools. The described techniques and tools can be applied separately or in combination. For example, a surround experience can be created by splitting input audio channel signals into high-pass and low-pass signals. The low-pass signals can undergo cross-mixing and artificial reverberation. The artificial reverberation can apply different delay profiles to the low-pass audio signals. The high-pass and low-pass audio signals can be combined to generate output audio channel signals. A surround experience can be crated using a system comprising an input module, a crossover module, a channel cross-mixing module, a reverberation module, and an adder module.

20 Claims, 7 Drawing Sheets

US 8,116,469 B2

HEADPHONE SURROUND USING ARTIFICIAL REVERBERATION

RELATED APPLICATION INFORMATION

The present application claims the benefit of U.S. Provisional Patent Application No. 60/904,753, entitled "AUDIO PLAYBACK TECHNIQUES AND TOOLS," filed Mar. 1, 2007, the disclosure of which is incorporated by reference.

BACKGROUND

In part, the quality of audio that is played back to a listener depends on how the audio was recorded and how the audio was compressed/decompressed (if at all). A playback device can sometimes perform processing during playback, however, to improve the listening experience.

One way of improving the listening experience when the listener is using headphones is to provide a surround experience. Due to the nature of headphones, which typically place speakers next to, or pushed into, the listener's ears, the sound field created by the headphone speakers is perceptually centered close to, or inside, the listener's head. This can be an undesirable result of listening to audio using headphones.

Some existing headphone surround techniques can provide a surround sound experience using long finite impulse response (FIR) filters. However, long FIR filters, even with fast Fourier transform (FFT) based block convolution, can be prohibitively complex for implementation on low power, or resource-constrained, devices.

Other existing headphone surround techniques can provide a surround sound experience using head related transfer functions (HRTFs). However, HRTFs can be difficult to implement and can require significant computing resources. For example, HRTFs can be difficult to tailor to provide a surround experience for all, or a majority of, listeners.

Therefore, there exists ample opportunity for improvement in technologies related to creating a surround experience for headphones.

SUMMARY

In summary, the detailed description is directed to various techniques and tools for creating a surround experience for headphones (e.g., during audio playback using an audio playback device).

A method of creating a surround experience for headphones can comprise receiving signals in two input audio channels (e.g., stereo). The input audio channel signals can be split into high-pass and low-pass audio signals. The low-pass audio signals can be cross-mixed. Artificial reverberation can be applied to the low-pass audio signals (e.g., after the cross-mixing). For each of the two input audio channels, the high-pass audio signal can be added to its corresponding low-pass audio signal to generate signals in two output audio channels. The output audio channel signals, which have been processed to create a surround experience, can be used to drive audio headphones (e.g., using an audio amplifier).

A system for creating a surround experience for headphones can comprise an input module for receiving signals in two input audio channels (e.g., stereo), a crossover module for splitting the input channel signals into high-pass and low-pass audio signals, a channel cross-mixer module for cross-mixing the low-pass audio signals, a reverberation module for applying artificial reverberation to the low-pass audio signals, and an adder module for combining the high-pass audio signal with its corresponding low-pass audio signal for each of the two input audio channels to generate signals in two output audio channels.

A system for creating a surround experience for headphones can comprise an input module for receiving a signal in one input audio channel (e.g., mono), a crossover module for splitting the mono input audio channel signal into a high-pass and a low-pass audio signal, a reverberation module for applying artificial reverberation to each of two copies of the low-pass audio signal, and an adder module for combining the high-pass audio signal with each copy of the low-pass audio signal to generate signals in two output audio channels.

A system for creating a surround experience for headphones can comprise a means for receiving signals in two input audio channels (e.g., stereo), a means for splitting the input channel signals into high-pass and low-pass audio signals, a means for cross-mixing the low-pass audio signals, a means for applying artificial reverberation to the low-pass audio signals, and a means for combining the high-pass audio signal with its corresponding low-pass audio signal for each of the two input audio channels to generate signals in two output audio channels.

Artificial reverberation can be used to introduce delay into the low-pass audio signals. For example, a different delay profile can be applied to each low-pass audio signal. The different delay profiles can be used to introduce different delays between the low-pass audio signals (e.g., different delays at different artificial reverberation stages).

Artificial reverberation can be applied using one or more all-pass filters. For example, three all-pass filters can be used for each of the low-pass audio signals. The all-pass filters can be Schroeder all-pass filters.

User-settable parameters can be received to control cross-mixing and/or artificial reverberation. For example, a user-settable parameter can be directly or indirectly received (e.g., from a user via a user interface element of a user interface) to control the amount of cross-mixing applied between low-pass audio signals. A user settable parameter can be directly or indirectly received to control the amount of delay applied to low-pass audio signals.

The described techniques and tools for headphone surround can be implemented separately or in combination. For example, the techniques and tools can be implemented as stages of a digital signal processing (DSP) pipeline.

DETAILED DESCRIPTION

The following description is directed to techniques, tools, and solutions for creating a surround experience for headphones.

The various techniques, tools, and solutions can be used in combination or independently. Different embodiments can implement one or more of the described techniques, tools, and solutions.

I. Computing Environment

The technologies, techniques, and solutions described herein can be implemented on any of a variety of devices (e.g., computing devices) in which audio signal processing is performed, including among other examples, computers; audio playing, transmitting and receiving equipment; portable audio players; DVD and CD players; audio conferencing; Web audio streaming applications; etc. For example, the technologies, techniques, and solutions described herein can be implemented in the audio playback system shown in FIG. 2. The technologies, techniques, and solutions described herein can be implemented in hardware circuitry (e.g., in circuitry of an ASIC, FPGA, etc.), as well as in audio processing software executing within a computing device or other computing environment (whether executed on the central processing unit (CPU), or digital signal processor (DSP), audio card, or the like), such as shown in FIG. 1.

Figure 1:
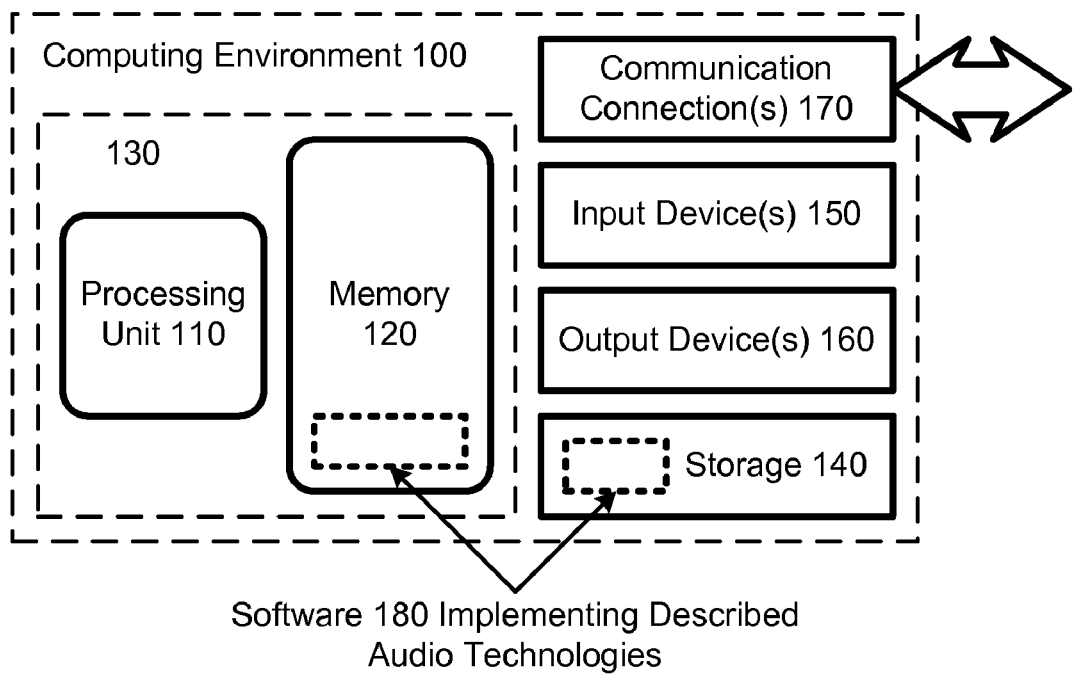
FIG. 1 is a block diagram of a suitable computing environment in which some described techniques and tools may be implemented.

FIG. 1 illustrates a generalized example of a suitable computing environment 100 in which described embodiments may be implemented. The computing environment 100 is not intended to suggest any limitation as to scope of use or functionality of the invention, as the present invention may be implemented in diverse general-purpose or special-purpose computing environments.

With reference to FIG. 1, the computing environment 100 includes at least one processing unit 110 and memory 120. In FIG. 1, this most basic configuration 130 is included within a dashed line. The processing unit 110 executes computer-executable instructions and may be a real or a virtual processor. In a multi-processing system, multiple processing units execute computer-executable instructions to increase processing power. The memory 120 may be volatile memory (e.g., registers, cache, RAM), non-volatile memory (e.g., ROM, EEPROM, flash memory, etc.), or some combination of the two. The memory 120 stores software 180 that can implement the technologies described herein. Also, as described above, the technologies described herein can also be implemented in hardware of the computing environment 100, or in a combination of software and hardware.

A computing environment may have additional features. For example, the computing environment 100 includes storage 140, one or more input devices 150, one or more output devices 160, and one or more communication connections 170. An interconnection mechanism (not shown) such as a bus, controller, or network interconnects the components of the computing environment 100. Typically, operating system software (not shown) provides an operating environment for other software executing in the computing environment 100, and coordinates activities of the components of the computing environment 100.

The storage 140 may be removable or non-removable, and includes magnetic disks, magnetic tapes or cassettes, CD-ROMs, CD-RWs, DVDs, or any other medium which can be used to store information and which can be accessed within the computing environment 100. The storage 140 can store instructions for the software 180 implementing the technologies described herein.

The input device(s) 150 may be a touch input device such as a keyboard, mouse, pen, or trackball, a voice input device, a scanning device, or another device that provides input to the computing environment 100. For audio, the input device(s) 150 may be a sound card or similar device that accepts audio input in analog or digital form, or a CD-ROM or CD-RW that provides audio samples to the computing environment. The output device(s) 160 may be a display, printer, speaker(s), CD-writer, headphones (e.g., stereo headphones) or another device that provides output from the computing environment 100.

The communication connection(s) 170 enable communication over a communication medium to another computing entity. The communication medium conveys information such as computer-executable instructions, compressed audio or video information, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The invention can be described in the general context of computer-readable media. Computer-readable media are any available media that can be accessed within a computing environment. By way of example, and not limitation, with the computing environment 100, computer-readable media include memory 120, storage 140, communication media, and combinations of any of the above.

The invention can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "check," "determine," and "find" to describe computer operations in a computing environment. These terms are high-level abstractions for operations performed by a computer, and should not be confused with acts performed by a human being. The actual computer operations corresponding to these terms vary depending on implementation.

II. Example Audio Playback System

Figure 2:
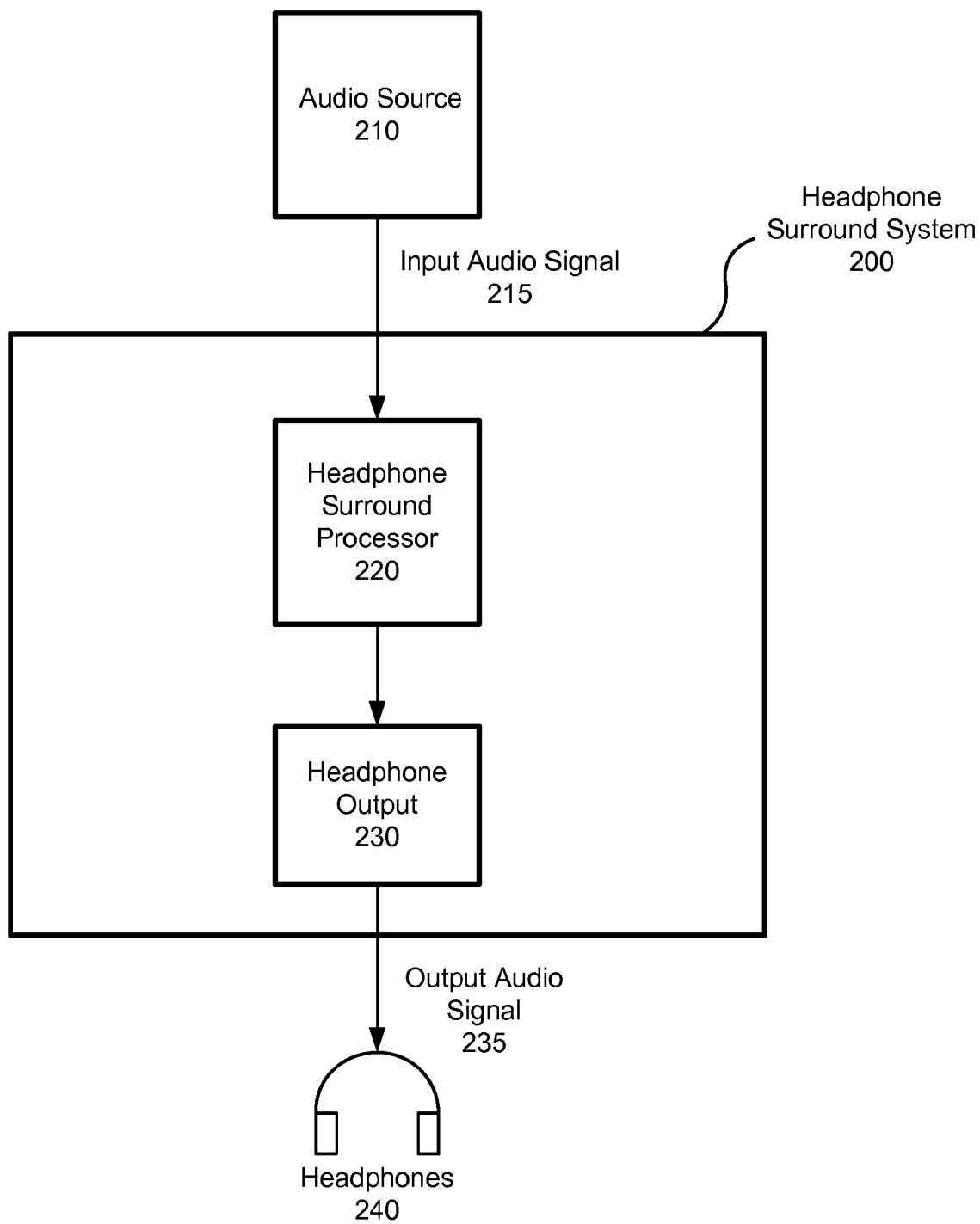
FIG. 2 is a block diagram of an audio playback system that can implement one or more of the headphone surround solutions described herein.

The headphone surround technologies described herein can be implemented on any of a variety of devices. For example, the system, depicted in FIG. 2, shows at a high level a device that can be used to implement the headphone surround technologies described herein.

In the example audio playback system for generating a surround experience, an input audio signal 215 is obtained from an audio source 210, which may be a CD player, digital media device (e.g., a digital audio player), decoder for a digital audio stream (e.g., in a Windows Media Audio (WMA), WMA Pro, or other digital audio format), or other audio signal source. In typical implementations, the audio signal is a two-channel audio signal (e.g., a stereo audio signal). In some implementations, the audio signal can comprise one or more audio channels (e.g., multi-channel audio such as 5.1 or 7.1). The audio content can be coded and decoded using a variant of WMA Pro, AC3, AAC or other coding/decoding technologies. The audio source 210 can be an external source (as shown in FIG. 2), or internally integrated in the headphone surround system 200.

The headphone surround system 200 includes a headphone surround processor 220. The headphone surround processor 220 receives the input audio signal 215 and performs various processing tasks (e.g., splitting channel signals into high-pass and low-pass audio signals, cross-mixing channels, applying artificial reverberation, and combining signals to produce output channels). The output audio signal from the headphone surround processor 220 is used by a headphone output module 230 (e.g., an audio amplifier and headphone jack) to produce the output audio signal 235 of the headphone surround system 200, which is used to drive audio headphones 240.

The headphone surround system 200 can also include other components. For example, it can include a user interface (e.g., a display such as a flat panel display) for receiving input from a user of the system 200. The user interface can be used to receive, for example, user-settable parameters used to control cross-mixing and/or artificial reverberation applied by the headphone surround processor 220.

In various applications, the headphone surround system 200 can be implemented using a digital signal processor (DSP) or more generally a central processing unit (CPU) programmed to perform the signal processing techniques described herein.

The relationships shown between modules within the system indicate the main flow of information in the system; other relationships are not shown for the sake of simplicity. Depending on implementation and the type of processing desired in the system of FIG. 2 (or the other systems shown in the various topology and path diagrams presented in other Figures of the application), modules can be added, omitted, split into multiple modules, combined with other modules, and/or replaced with like modules.

III. Innovations in Headphone Playback for Creating a Surround Experience

This section describes techniques and solutions that can be applied to create a surround sound experience for headphones. For example, some of the techniques and solutions described in this section provide surround sound effects (e.g., low-complexity surround sound effects) during headphone playback by using algorithms that incorporate crossovers, cross-mixing, and artificial reverberation.

Surround sound effects provided using long finite impulse response (FIR) filters can provide good performance in many scenarios. In some scenarios, however, using long FIR filters, even with FFT-based block convolution, can be prohibitively complex. This can be the case, for example, for implementations on low power, or resource-constrained, devices.

Many factors affect the quality of surround sound effects during headphone playback. One factor is simulation of spatial directions. Another factor is the presence of a very long and chaotic impulse response. One way to achieve such a response is by using all-pass filters (e.g., Schroeder all-pass filters), like those used for artificial reverberation. In conjunction with cross-mixing of the channels, such filters can provide a very effective surround experience without requiring much processing power.

In general, an example topology for headphone playback with surround sound effects can incorporate crossover filtering, channel cross-mixing, and/or artificial reverberation techniques. For example, stereo input channels can be directed to a channel mixing module, which produces two outputs. Each output can be routed to an independent chain of modules. The same number and arrangement of modules can be used for each output chain, but different numbers and/or arrangements could be used instead.

In a particular chain, a crossover module can accept an output of the channel mixing module and produce a low-pass signal and a high-pass signal. The low-pass signal can pass through multiple (e.g., three) all-pass filters (for example, Schroeder filters). Alternatively, another number of filters and/or different kind of all-pass filter can be used. The output of the all-pass filtering can be combined with the high-pass signal and used as the output channel.

The resulting stereo output channels now incorporate surround sound effects. The stereo output can be used to drive headphones (e.g., using an audio amplifier).

The all-pass filters in the respective chains can be configured the same or differently. By using all-pass filters with subtly different delay parameters for the two output channels, a system that not only simulates a surround experience from stereo sources, but also creates a stereo effect for mono sources, can be obtained. Even for stereo sources, this can be a desirable property for a headphone surround system because many music passages contain little stereo, and such passages can sound very boring through headphones. To reduce the overall stereo image shift from using different delays, the choice of which channel has the longer delay from one all-pass section to the next can alternate. Alternatively, a system provides artificial reverberation using another mechanism.

Although the all-pass filters can be used on both the low-pass signal and high-pass signal of the crossover module (or on the output of the channel mixing module itself), there are advantages in some implementations to using the all-pass filters on the low-pass signals in many cases. In general, using all-pass sections involves a tradeoff between the density of the impulse response (a desired property) and perceptually unpleasant smearing and combing of high frequencies. This problem can be reduced by using a topology (e.g., as described with reference to FIGS. 3, 4, 5, and 6) that puts all-pass filters in the low-pass chain of a crossover-based topology. The crossover filter allows artificial reverberation to be applied to lower frequencies, while higher frequencies are passed through to the output mostly unaltered.

In addition, while artificial reverberation can be directly applied to input channels (e.g., using all-pass filters) or applied after separation with a crossover filter, there are advantages to using channel mixing in many cases. For simulating a surround field for stereo sources, HRTFs (head related transfer functions) are less critical and can be effectively replaced with a simple cross-mixing of the two channels for some low-power (or resource constrained) device implementations (e.g., a portable audio device with limited processing capabilities and/or limited memory).

Figure 3:
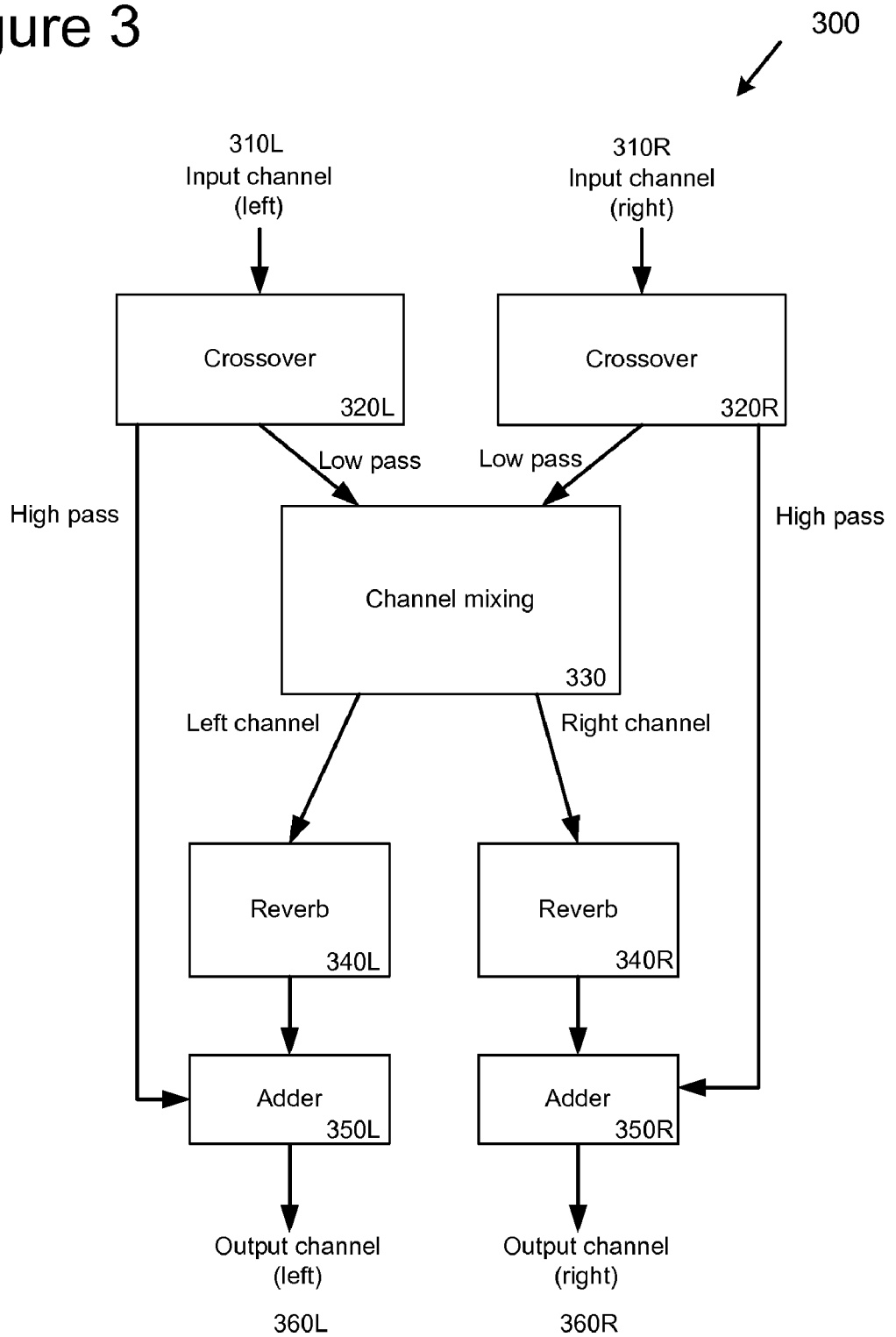
FIG. 3 depicts an example block diagram for creating a surround experience for headphones using crossovers, channel mixing, and reverberation.

FIG. 3 depicts an example block diagram 300 of a topology for creating a surround experience for headphones using crossovers, channel mixing, and reverberation. For example, the block diagram 300 can be implemented by one or more digital signal processors in a portable audio device. The block diagram 300 can be implemented by hardware, software, or a combination of hardware and software.

In the block diagram 300, signals in two input channels (left 310L and right 310R) are received. For example, the two input channel signals (or "input channels" for short) can be received as a two-channel (e.g., stereo) audio signal.

The two input channels (310L and 310R) are routed to a crossover module. In the example block diagram 300, the crossover module is implemented with two crossovers (320L and 320R), one for each channel. The two crossovers (320L and 320R) split the respective input channels into high-pass audio signals and low-pass audio signals. For example, each of the crossovers (320L and 320R) can be implemented using a second order infinite impulse response low-pass filter to produce the low-pass audio signal, with the algebraic complement used to produce the high-pass audio signal (e.g., with a subtractive crossover). Alternatively, another type of filter can be used to implement the crossovers. The high-pass audio signals from the respective channels proceed directly to the adders (350L and 350R). The low-pass audio signals from the respective channels proceed to the channel mixer 330.

The channel mixing module 330 cross-mixes the low-pass audio signals. For example, the channel mixing module 330 can mix a portion of the low-pass audio signal of the left channel with a portion of the low-pass audio signal of the right channel, and mix a portion of the low-pass audio signal of the right channel with a portion of the low-pass audio signal of the left channel. The cross-mixing can be implemented, for example, using two amplifiers and using the gains of the respective amplifiers to control the amount of cross-mixing.

The amount of cross-mixing can be controlled by a user. For example, a user-settable parameter can be received (e.g., via a user interface) indicating the amount of cross-mixing to apply. The user-settable parameter can be used to control the amount of cross-mixing by directly or indirectly specifying the amount of amplifier gain to apply to the different amplifiers.

After the channel mixing module 330, the left and right channel low-pass audio signals proceed to a reverberation module (340L and 340R). The reverberation module (340L and 340R) applies artificial reverberation (e.g., digital reverberation) to each of the low-pass audio signals. The reverberation module can apply a delay profile to each of the low-pass audio signals. For example, the reverberation module (340L and 340R) can apply a different delay profile to each of the low-pass audio signals. The delay profile can specify the amount of delay to apply. For example, the delay profile can specify a delay amount or value (e.g., a different delay amount or value) for each of multiple stages reverberation (e.g., for each of multiple filter stages). The delay profile can specify a different delay at different reverberation stages while specifying the same overall total delay for each of the low-pass audio signals. The delay profile can also specify a different delay at different reverberation stages while specifying a different overall total delay for each of the low-pass audio signals. For example, a different overall total delay for each of the low-pass audio signals (applied by the reverberation module) can be compensated for by applying additional delay to one of the channels The reverberation module (340L and 340R) can be implemented, for example, using all-pass filters (e.g., Schroeder all-pass filters). For example, one or more all-pass filters can be used for the reverberation module (340L and 340R) for each low-pass audio signal. Instead of all-pass filters, other digital or artificial reverberation techniques can be used.

After the reverberation module (340L and 340R), the left and right channel low-pass audio signals proceed to an adder module (350L and 350R). The adder module (350L and 350R) combines the low-pass audio signal with the high-pass audio signal for each channel. After being combined, signals in the left 360L and right 360R channels are output.

In an alternative implementation, the locations of the channel mixing module 330 and the reverberation module (340L and 340R) are switched, such that the low-pass audio signals pass through the reverberation module (340L and 340R) and subsequently pass through the channel mixing module 330 and finally to the adder module (350L and 350R). Swapping the position of the reverberation module (340L and 340R) with the channel mixing module 330 can be performed without significantly affecting the surround experience of the example topology 300. However, when swapping positions of reverberation and channel mixing, it may be necessary to use different delay values in the reverberation module (e.g., depending on the amount of gain from the channel mixing module).

In the example block diagram 300, the same number and arrangement of modules is shown for each channel (left and right), but different numbers and/or arrangements could be used instead.

The various components of the example block diagram 300 contribute different aspects to the overall headphone surround effect. For example, by using the crossover module (320L and 320R) to split the input audio channels into high-pass and low-pass audio signals, the channel mixing and reverberation modules can be applied only to the low-pass audio signals, and not to the high-pass audio signals. Keeping the high-pass audio signals free from reverberation can help to prevent smearing of the high frequencies. Keeping the high-pass audio signals free from channel mixing can help to prevent an unnatural collapse of the stereo image. High frequencies typically get less cross-side mixing in a natural environment because the HRTFs for signals traveling all the way around a listener's head tend to incur considerable high-frequency attenuation.

Channel mixing (e.g., 330) can help to create a surround experience with headphones. For example, channel mixing can be used to narrow or widen the field. Narrowing the field can create the effect of speaker positions. Widening the field can create a spatialization effect.

Artificial reverberation (e.g., 340L and 340R) can also help to create a surround experience with headphones. For example, by varying the delay between channels (e.g., introducing different delays at different stages of reverberation filtering between channels), a surround sound effect can be created. Artificial reverberation can benefit stereo content as well as mono content present in a stereo signal (e.g., a significant amount of mono content can be present in a stereo signal). For example, using artificial reverberation can produce a stereo effect when applied to mono content.

Figure 4:
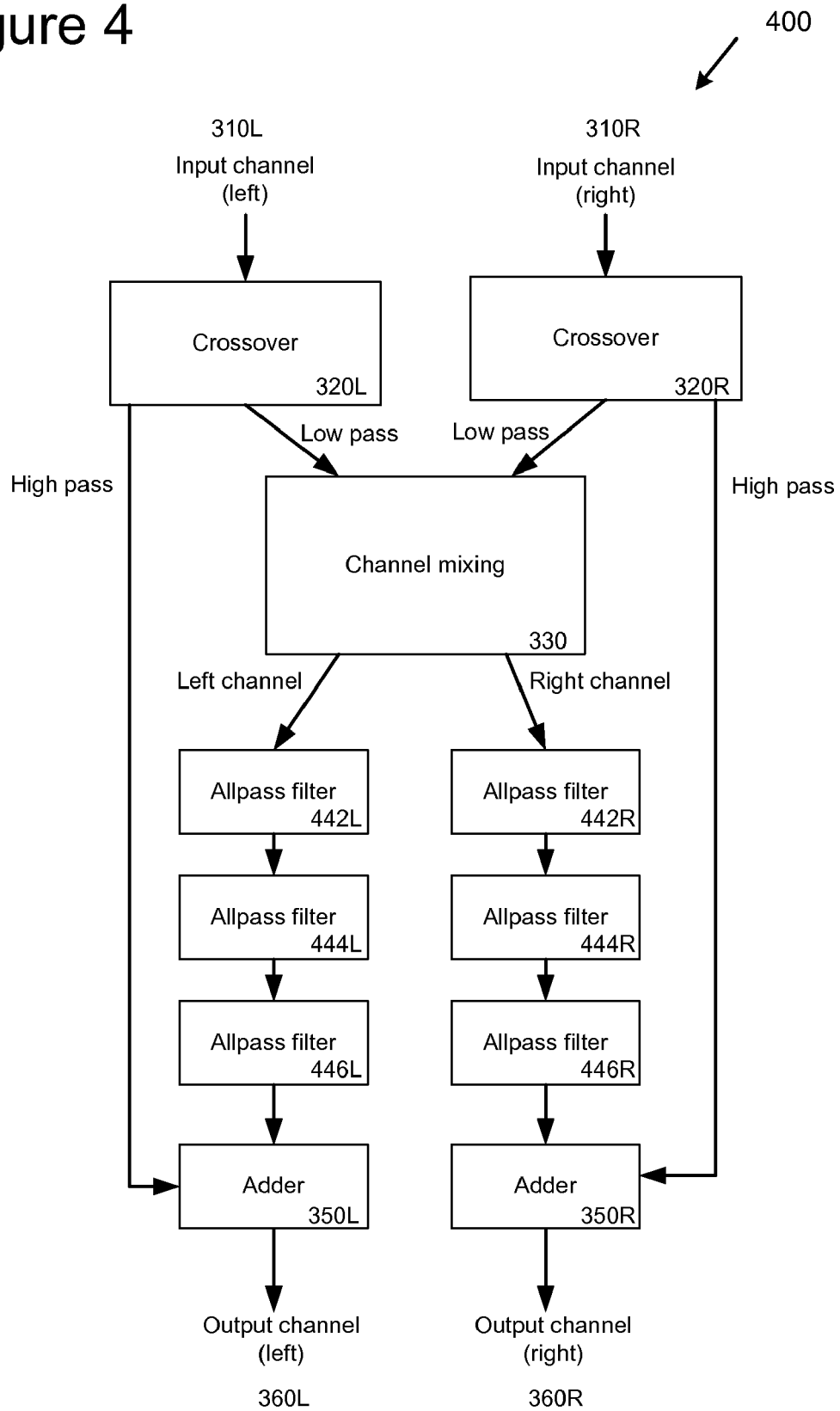
FIG. 4 depicts an example block diagram for creating a surround experience for headphones using all-pass filters for artificial reverberation.

FIG. 4 depicts an example block diagram 400 of a topology for creating a surround experience for headphones using all-pass filters. For example, the block diagram 400 can be implemented by one or more digital signal processors in a portable audio device. The block diagram 400 can be implemented by hardware, software, or a combination of hardware and software.

Most of the modules of the block diagram 400 are described above with reference to FIG. 3. In the specific implementation depicted in block diagram 400, the artificial reverberation is implemented using all-pass filters (442L, 442R, 444L, 444R, 446L, and 446R). Each of the left and right channel low-pass audio signals passes through an independent series of three all-pass filters. For example, the left channel low-pass audio signal passes through all-pass filters 442L, 444L, and 446L.

As depicted in the block diagram 400, each of the left and right low-pass audio signals can pass through the same number of all-pass filters. The all-pass filters for each low-pass audio signal can be identified by stage (e.g., position). For example, all-pass filters 442L and 442R can be identified as the first stage (or first position) of all-pass filters, all-pass filters 444L and 444R as the second stage, and all-pass filters 446L and 446R as the third stage.

Each of the all-pass filters (442L, 442R, 444L, 444R, 446L, and 446R) can apply a delay to its corresponding low-pass audio signal. Different all-pass filters can apply different delays. By varying delay values between the two low-pass audio signals, a spatialization effect can be created.

In a specific implementation, each stage is configured to apply its own delay. For example, the all-pass filters of the first stage (442L and 442R) can apply delay D1, the all-pass filters of the second stage (444L and 444R) can apply delay D2, and the all-pass filters of the third stage (446L and 446R) can apply delay D3. The delay values, D1, D2, and D3, can be different delay values or the same delay value.

In addition to the delay values D1, D2, and D3, an additional delay value can be added. The additional delay value can be added at different stages (or positions) in the series of all-pass filters. For example, at the first stage, a small additional delay $\Delta 1$ can be added to the delay of just the right channel low-pass audio signal all-pass filter 442R. The delay of 442R would then be D1+$\Delta 1$. At the second stage, the small additional delay $\Delta 2$ (which can be the same value, or a different value, than $\Delta 1$) can be added to the delay of just the left channel low-pass audio signal all-pass filter 444L. The delay of 444L would then be D2+$\Delta 2$. The additional delay values, $\Delta 1$ and $\Delta 2$, can be small relative to the regular delay values D1, D2, and D3. By varying the delay between the low-pass audio signals at each stage (e.g., 442L delay is D1, 442R delay is D1+$\Delta 1$, 444L delay is D2+$\Delta 2$, 444R delay is D2, 446L delay is D3, and 446R delay is D3), a spatialization effect can be created. Alternating which low-pass audio signal (left or right channel) receives the small additional delay at a particular stage can reduce the overall stereo image shift from using different delay values between the channels.

In some implementations, the small additional delay values (e.g., $\Delta 1$ and $\Delta 2$) and/or base delay values (e.g., D1, D2, and D3) can be directly or indirectly controlled by a user (e.g., they can be user-settable parameters). For example, a user interface can display a user interface element (e.g., data entry field, slider, drop-down list, etc.) allowing a user to enter (e.g., directly or via translation) one or more small additional delay values and/or base delay values. The values received from the user can be used to directly or indirectly (e.g., via translation) configure the delay values. For example, a user setting named "reverb control" or "artificial spatialization" can be translated into a single-digit to low double-digit number, and that number can be used as $\Delta 1$ and $\Delta 2$. In another implementation, $\Delta 1$ and $\Delta 2$ can be derived from a common setting using some mathematical formula (e.g., a simple translation). In a more advanced implementation, $\Delta 1$ and $\Delta 2$ can be derived from separate user-setabble parameters (e.g., two sliders or dials with abstract ranges from "low" to "high").

Figure 5:
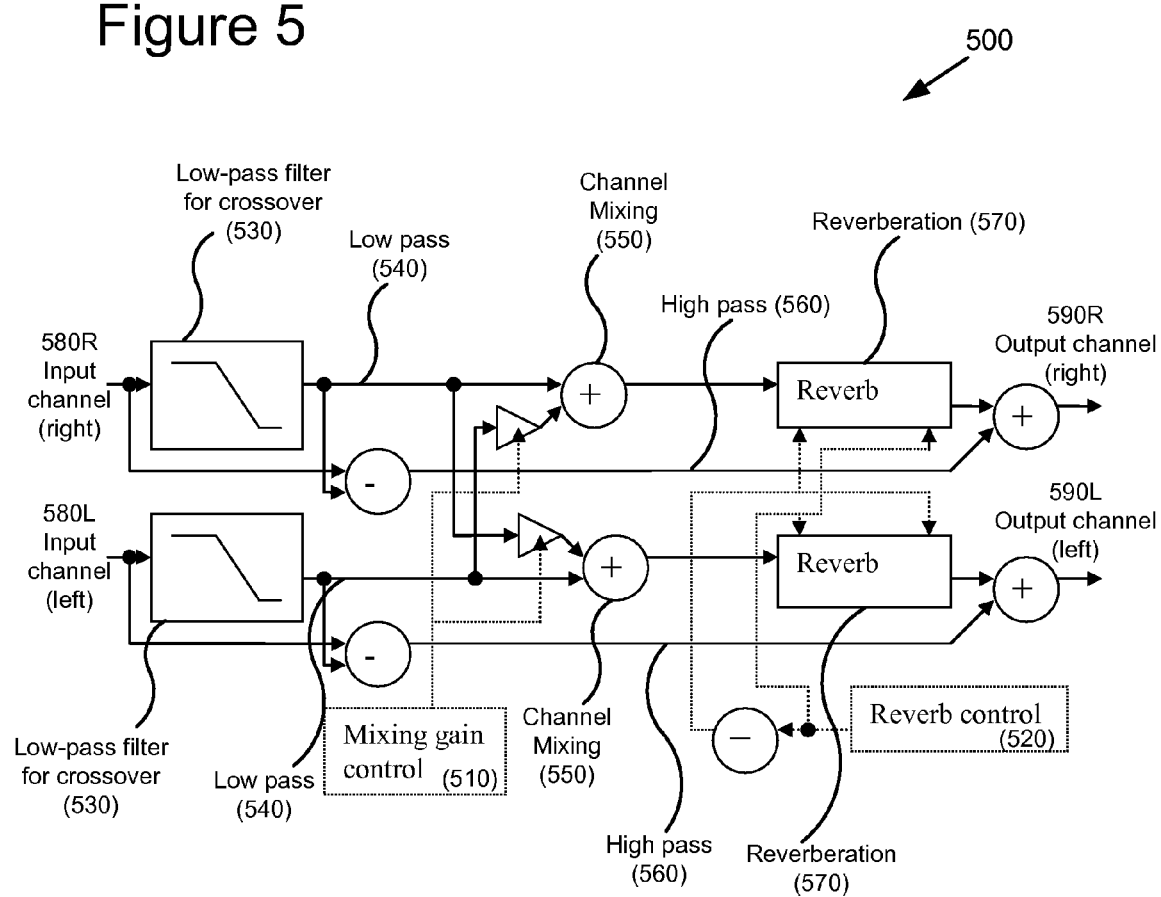
FIG. 5 depicts an example diagram for creating a surround experience for headphones with user-controllable settings.

FIG. 5 shows an example diagram 500 depicting a topology for creating a surround experience for headphones using crossovers, channel mixing, and reverberation. For example, the diagram 500 can be implemented by one or more digital signal processors in a portable audio device. The diagram 500 can be implemented by hardware, software, or a combination of hardware and software.

In the diagram 500, signals in two input channels (left 580L and right 580R) are split, using a crossover module 530, into low-pass 540 and high-pass 560 audio signals. The diagram 500 depicts two crossovers, one for each input channel. The crossover for a channel is implemented with a low-pass filter and a subtractor. Alternatively, a different number of crossovers can be used.

After the crossover module 530, a channel cross-mixing module 550 cross-mixes the low-pass audio signals. In the diagram 500, the amount of channel cross-mixing is controlled by the mixing gain control 510 (e.g., controlled by a user-settable parameter). The mixing gain control 510 controls the amount of cross-mixing by controlling the gain values (the dashed lines going to the amplifiers (shown as triangles) for the low-pass audio signals). For example, the mixing gain control 510 can be controlled based on a user-settable parameter received from a user via a user interface (e.g., the user can enter a value used to directly or indirectly control the amount of gain applied by the mixing gain control 510).

After the channel cross-mixing module 550, the low-pass audio signals proceed through a reverberation module 570. For example, the reverberation module 570 can be implemented as a series of all-pass filters (e.g., Schroeder all-pass filters). The reverberation module 570 can introduce slightly different delays in the low-pass audio signals of the two channels (e.g., different delays at different stages of the reverberation module 570). For example, the reverberation module 570 can be implemented using a series of three all-pass filters (e.g., Schroeder all-pass filters) as described with reference to FIG. 4.

In the diagram 500, the amount of reverberation is controlled by the reverb control 520. The reverb control can be a user control (e.g., controlled by a user-settable parameter). For example, a user interface element can be provided via a user interface of an audio playback device. The user interface element can be used to receive user input (e.g., a user-settable parameter) for directly or indirectly controlling the reverb. For example, the user interface element can accept direct values (e.g., direct delay values) or an arbitrary value or setting (e.g., a low, medium, or high slider position) which can be used to determine delay values (e.g., via translation).

After the reverberation module 570, the low-pass audio signal for each channel is combined with its corresponding high-pass audio signal to produce the left 590L and right 590R channel output signals, which now incorporate surround sound effects.

Figure 6:
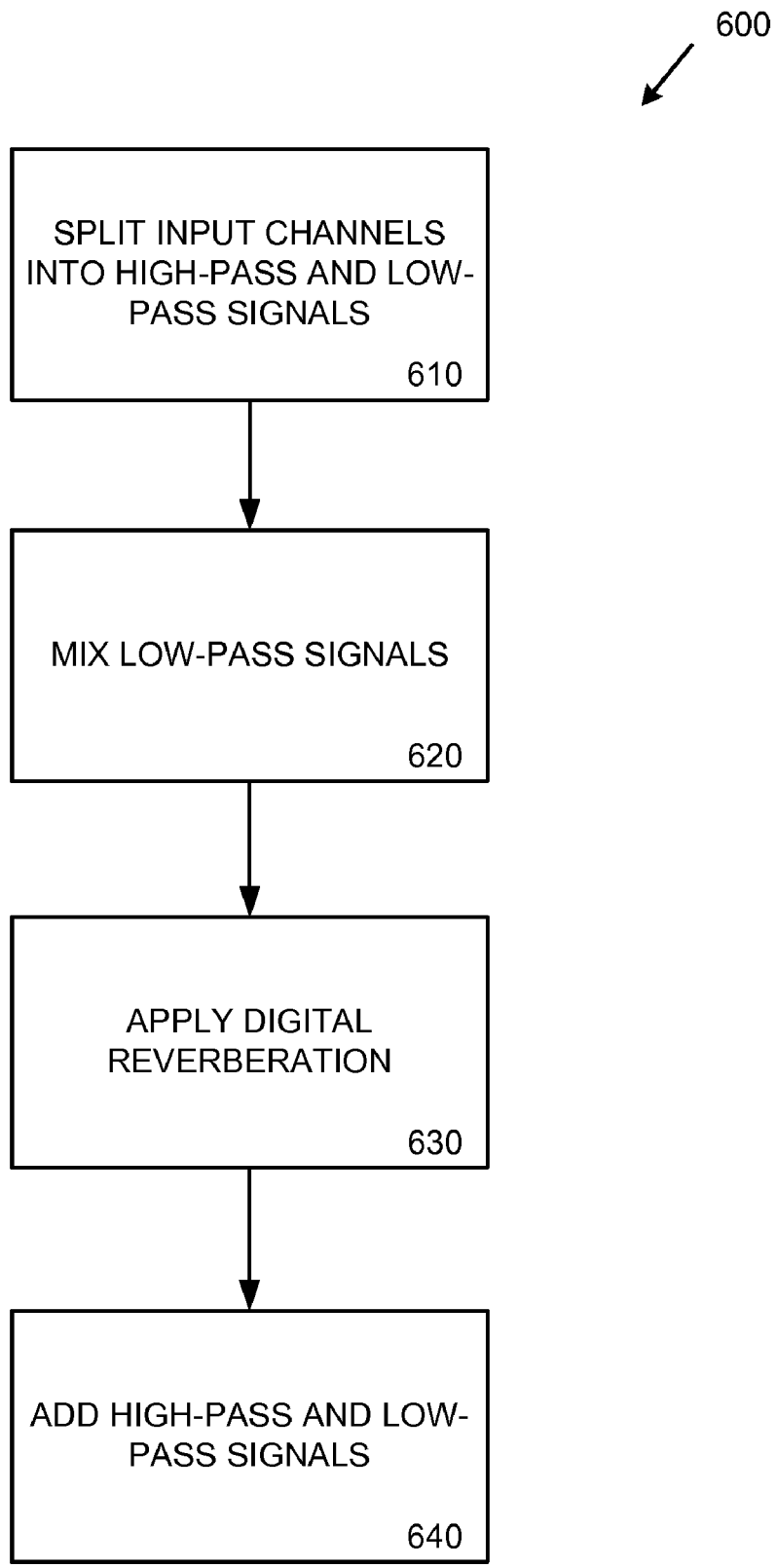
FIG. 6 depicts an example method for creating a surround experience for headphones.

FIG. 6 shows an example method 600 for creating a surround experience for headphones. For example, the example method 600 can be implemented using a topology such as that depicted in FIG. 3, 4, or 5.

At 610, signals in input audio channels (e.g., two input audio channels) are split into high-pass and low-pass audio signals. For example, the input audio channel signals can be split using a crossover module.

At 620, the low-pass audio signals are cross-mixed. For example, the cross-mixing can be performed using a cross-mixing module.

At 630, artificial reverberation (e.g., digital reverberation) is applied to the low-pass audio signals. For example, the artificial reverberation can be applied using a reverberation module. The reverberation can be applied using all-pass filters (e.g., Schroeder all-pass filters). The artificial reverberation can be applied using different delay values between the two low-pass audio signals (e.g., varying delay values between the low-pass audio signals at different stages of reverberation filtering).

At 640, the low-pass audio signals are combined with their corresponding high-pass audio signals to produce signals in two output audio channels. For example, the combining can be performed using an adder module.

The example techniques, solutions, and implementations described herein (e.g., as described with reference to FIGS. 3, 4, 5, and 6) can be used to create surround sound effects from stereo audio input for headphone playback. For example, the two input channels (e.g., 310L and 310R, 580L and 580R) can be left and right stereo input signals. Various types of processing can be applied to the input channels in order to create a surround experience (e.g., using crossovers such as 320L, 320R, and 530, cross-mixing such as 330 and 550, and/or artificial reverberation such as 340L, 340R, 442L, 442R, 444L, 444R, 446L, and 446R, and 570). Finally, the two output channels (e.g., 360L and 360R, 590L and 590R) can be left and right stereo audio output signals incorporating surround sound effects.

Figure 7:
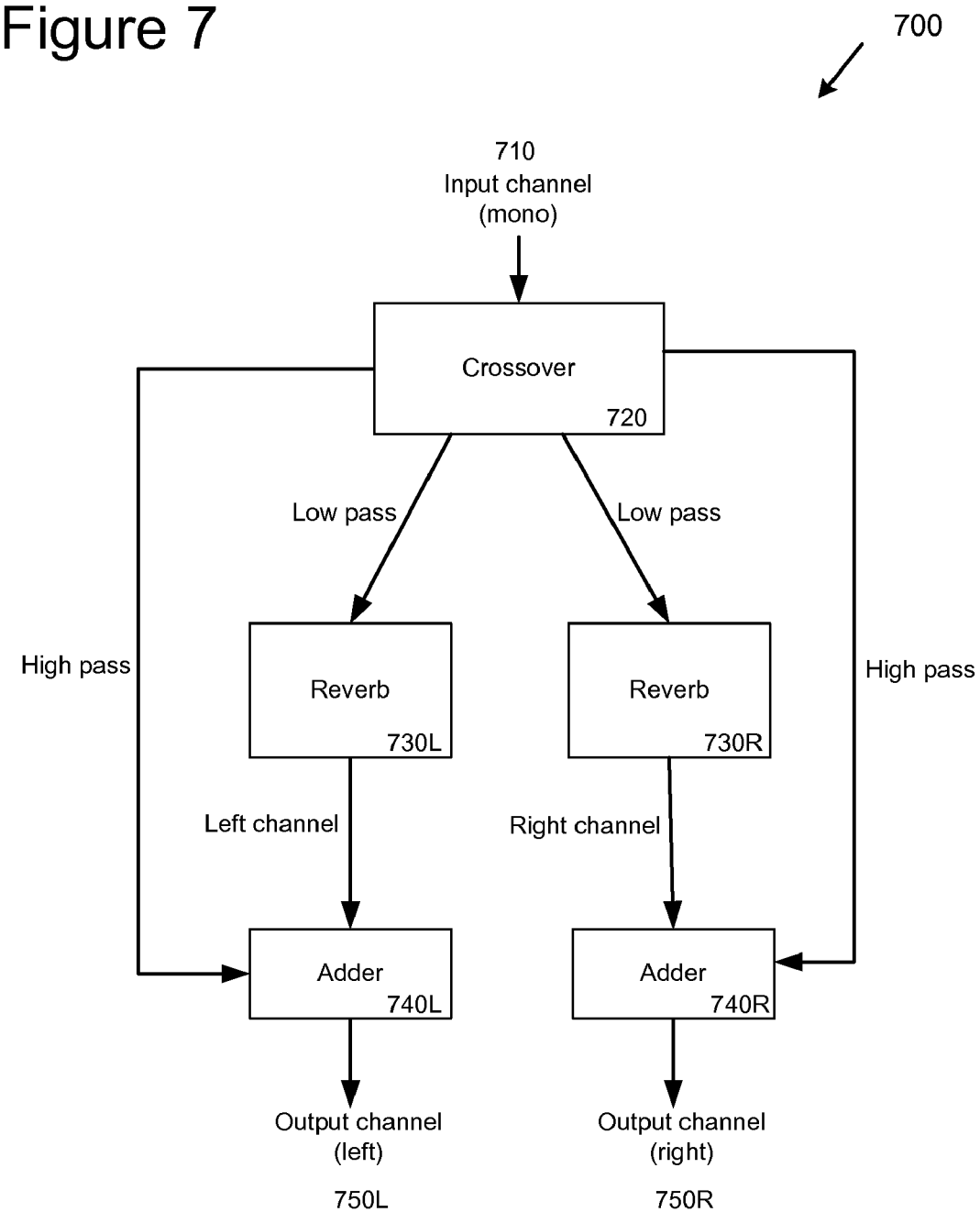
FIG. 7 depicts an example block diagram for creating a surround experience for headphones for single-channel (mono) sources.

FIG. 7 depicts an example block diagram 700 of a topology for creating a surround experience for headphones for single-channel (mono) sources. For example, the block diagram 700 can be implemented by one or more digital signal processors in a portable audio device. The block diagram 700 can be implemented by hardware, software, or a combination or hardware and software.

In the block diagram 700, a signal in a single (mono) input channel 710 is received. The single input channel signal 710 is routed to a crossover module 720. The crossover module 720 splits the single input channel signal 710 into a high-pass audio signal and a low-pass audio signal. For example, the crossover 720 can be implemented using a second order infinite impulse response low-pass filter to produce the low-pass audio signal, with the algebraic complement used to produce the high-pass audio signal (e.g., with a subtractive crossover). Alternatively, another type of filter can be used to implement the crossover.

The high-pass audio signal from the crossover 720 proceeds directly to the adder module (740L and 740R). In FIG. 7, the two high-pass audio signal lines from the crossover 720 carry the same high-pass audio signal (i.e., two copies of the high-pass audio signal).

The low-pass audio signal from the crossover 720 proceeds to the reverb module (730L and 730R). In FIG. 7, the two low-pass audio signal lines from the crossover 720 carry the same low-pass audio signal (i.e., two copies of the low-pass audio signal).

In order to simulate stereo channels from the single input channel 710, the reverberation module (730L and 730R) applies a different delay profile to each copy of the low-pass audio signal. As described herein, the reverberation module (730L and 730R) can be implemented using all-pass filters (e.g., Schroeder all-pass filters). User-settable parameters can be used to control delay introduced by the reverberation module (730L and 730R).

After the reverberation module (730L and 730R), the left and right channel low-pass audio signals proceed to the adder module (740L and 740R). The adder module (740L and 740R) combines the left and right low-pass audio signal from the reverberation module (730L and 730R) with the high-pass audio signal. After being combined, signals in the left 750L and right 750R channels are output.

Thus, solutions for providing surround sound effects during headphone playback (e.g., to create a surround sound experience using an audio playback device coupled to stereo headphones) can include the use of artificial reverberation techniques (e.g., implemented with all-pass sections) for simulating a headphone surround experience in resource-constrained computing devices. The artificial reverberation can be applied in a separate reverberation module or in another module.

The solutions described in this section can be used with mono or multi-channel audio sources such as stereo sources.

Solutions for providing surround sound effects during headphone playback can include the use of all-pass filters with slightly different settings for the two output channels to simulate a stereo experience for mono sources or mono passages of multi-channel sources. As noted above, solutions for headphone surround can include various choices of all-pass section delay numbers.

Artificial reverberation can be applied across the spectrum of a signal, or it can be applied to a particular frequency range (e.g., low-pass part) of the signal. Solutions for headphone surround can include use of a topology that places artificial reverberation on one side of a crossover filter (e.g., a biquad IIR complementary design crossover filter), so as to introduce the artificial reverberation to one component (e.g., a low-pass component) of the signal. The crossover filter can be a separate filter or part of another filter.

In some implementations, a crossover filter is implemented as part of another filter, or in conjunction with other filtering, that produces a low pass signal as one or more signal components and a high pass signal as one or more signal components. At least one of the low pass signal components is the "low pass signal" for purposes of channel mixing, application of reverberation, etc., and at least one of the high pass signal components is the "high pass signal" that passes through without such channel mixing, application of reverberation, etc. Other signal components may be further processed or pass through. Some or all of the various signal components (including the "low pass signal" and the "high pass signal") are recombined in an "adding" operation.

Although introduction of artificial reverberation can have advantages regardless of whether channel mixing is used, solutions for headphone surround can include use of channel cross-mixing as a substitute for HRTFs, or as part of HRTFs, for resource-constrained computing devices. Or, HRTFs can be used followed by introduction of artificial reverberations with or without a crossover filter, for example, effectively providing cross-mixing on computing devices that are not resource constrained.

Solutions for headphone surround can also include an integer-only implementation comprising one or more of the above-described solutions. Or, they can include non-integer implementations of one or more of the above-described solutions.

Solutions for headphone surround can be implemented via software, hardware, or a combination thereof.

Any of the methods described herein can be performed via one or more computer-readable media (e.g., storage or other tangible media) having computer-executable instructions for performing (e.g., causing a computing device or computer to perform) such methods. Operation can be fully automatic, semi-automatic, or involve manual intervention.

Having described and illustrated the principles of our innovations in the detailed description and accompanying drawings, it will be recognized that the various embodiments can be modified in arrangement and detail without departing from such principles. It should be understood that the programs, processes, or methods described herein are not related or limited to any particular type of computing environment, unless indicated otherwise. Various types of general purpose or specialized computing environments may be used with or perform operations in accordance with the teachings described herein. Elements of embodiments shown in software may be implemented in hardware and vice versa.

In view of the many possible embodiments to which the principles of our invention may be applied, we claim as our invention all such embodiments as may come within the scope and spirit of the following claims and equivalents thereto.

We claim:

1. A method of creating a surround experience for headphones, the method comprising:
   receiving a first input audio channel signal and a second input audio channel signal;
   splitting each of the first and second input audio channel signals into a high-pass audio signal and a low-pass audio signal;
   cross-mixing the low-pass audio signal of the first input audio channel signal and the low-pass audio signal of the second input audio channel signal;
   adjusting each of the low-pass audio signals by applying artificial reverberation, wherein the applying artificial reverberation comprises applying a different delay profile to each of the low-pass audio signals;
   adding the high-pass audio signal and the adjusted and cross-mixed low-pass audio signal for each of the first and second input audio channel signals to generate a first output audio channel signal and a second output audio channel signal.

2. The method of claim 1 wherein the splitting is performed by a first audio crossover for the first input audio channel signal and by a second audio crossover for the second input audio channel signal, wherein each of the first and second audio crossovers is implemented using a second order infinite impulse response low-pass filter.

3. The method of claim 1 wherein the artificial reverberation is applied to each of the low-pass audio signals after the cross-mixing.

4. The method of claim 1 wherein the artificial reverberation is applied using a plurality of all-pass filters in series, wherein the applying the different delay profile to each of the low-pass audio signals comprises applying different delays at different positions in the series of all-pass filters between each of the low-pass audio signals.

5. The method of claim 1 wherein the applying artificial reverberation comprises:
   applying a first delay profile to the low-pass audio signal of the first input audio channel signal using one or more all-pass filters; and
   applying a second delay profile to the low-pass audio signal of the second input audio channel signal using one or more all-pass filters;
   wherein the first delay profile is different from the second delay profile.

6. The method of claim 5 wherein the one or more all-pass filters used to apply the first delay profile are Schroeder all-pass filters, and wherein the one or more all-pass filters used to apply the second delay profile are Schroeder all-pass filters.

7. The method of claim 1 wherein the applying artificial reverberation comprises:
   for the low-pass audio signal of the first input audio channel signal, passing the low-pass audio signal through a series of three Schroeder all-pass filters, wherein each of the three Schroeder all-pass filters introduces a delay;
   for the low-pass audio signal of the second input audio channel signal, passing the low-pass audio signal through a series of three Schroeder all-pass filters, wherein each of the three Schroeder all-pass filters introduces a delay corresponding to the delay introduced by the Schroeder all-pass filter of the low-pass audio signal of the first input audio channel signal at the same stage of the series;
   wherein one of the three Schroeder all-pass filters for the low-pass audio signal of the first input audio channel signal introduces a small additional delay when passing the low-pass audio signal through the series of three Schroeder all-pass filters;
   wherein one of the three Schroeder all-pass filters for the low-pass audio signal of the second input audio channel signal introduces the small additional delay when passing the low-pass audio signal through the series of three Schroeder all-pass filters, wherein the small additional delay for the low-pass audio signal of the second input audio channel signal is introduced using a Schroeder all-pass filter at a different stage of the series than the small additional delay for the low-pass audio signal of the first input audio channel signal.

8. The method of claim 7 further comprising:
   receiving a user-settable parameter used to control the small additional delay.

9. The method of claim 1 further comprising:
   receiving a user-settable parameter that controls the cross-mixing by indicating an amount of channel cross-mixing to apply between the low-pass audio signal of the first input audio channel signal and the low-pass audio signal of the second input audio channel signal.

10. The method of claim 1, wherein the method is performed using integer calculations.

11. The method of claim 1, wherein the method is implemented by a portable computing device.

12. One or more computer-readable media comprising computer-executable instructions for causing a computing device to perform the method of claim 1.

13. A system for creating a surround experience for headphones, the system comprising:
   an input module for receiving two input audio channel signals;
   a crossover module for splitting each channel signal of the two input audio channel signals into a high-pass audio signal and a low-pass audio signal;
   a channel cross-mixing module for cross-mixing the low-pass audio signals;
   a reverberation module for applying artificial reverberation to each of the cross-mixed low-pass audio signals, wherein the reverberation module applies a different delay profile to each of the low-pass audio signals;
   an adder module for combining the high-pass audio signal and the reverberation-applied and cross-mixed low-pass audio signal for each channel signal of the two input audio channel signals to generate two output audio channel signals.

14. The system of claim 13 wherein the crossover module comprises an audio crossover for each channel signal of the two input audio channel signals, and wherein each crossover is implemented using a second order infinite impulse response low-pass filter.

15. The system of claim 13 wherein the reverberation module comprises a plurality of Schroeder all-pass filters in series for each of the cross-mixed low-pass audio signals, wherein applying the different delay profile to each of the low-pass audio signals comprises applying different delays at different positions in the series of Schroeder all-pass filters between each of the low-pass audio signals.

16. The system of claim 13 wherein the reverberation module comprises:
   two sets of three Schroeder all-pass filters in series, one set for each of the low-pass audio signals, for introducing delay in each of the low-pass audio signals, wherein delay amount is different between corresponding Schroeder all-pass filters in the series for each of the low-pass audio signals.

17. The system of claim 13 further comprising:
a user input module for receiving a user-settable parameter used to control a delay amount applied by the reverberation module.

18. The system of claim 13 further comprising:
a user input module for receiving a user-settable parameter that controls the cross-mixing by indicating an amount of cross-mixing between the low-pass audio signals.

19. A system for creating a surround experience for headphones, the system comprising:
an input module for receiving a mono input audio channel signal;
a crossover module for splitting the mono input audio channel signal into a high-pass audio signal and a low-pass audio signal;
a reverberation module for applying artificial reverberation to two copies of the low-pass audio signal, wherein the reverberation module applies a different delay profile to each copy of the low-pass audio signal, and wherein the reverberation module produces a left and right low-pass audio signal; and
an adder module for combining the high-pass audio signal with each of the left and right low-pass audio signals to generate left and right output audio channel signals.

20. The system of claim 19 wherein the reverberation module comprises:
two sets of three Schroeder all-pass filters in series, one set for each copy of the low-pass audio signal, for introducing delay in each copy of the low-pass audio signal, wherein delay amount is different between corresponding Schroeder all-pass filters in the series for each copy of the low-pass audio signal.

* * * * *